United States Patent
Plikat

(10) Patent No.: US 6,784,487 B2
(45) Date of Patent: Aug. 31, 2004

(54) MONOLITHCALLY INTEGRATED SEMICONDUCTOR COMPONENT

(75) Inventor: Robert Plikat, Vaihingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/220,084

(22) PCT Filed: Feb. 23, 2001

(86) PCT No.: PCT/DE01/00708
§ 371 (c)(1), (2), (4) Date: Aug. 26, 2002

(87) PCT Pub. No.: WO01/67515
PCT Pub. Date: Sep. 13, 2001

(65) Prior Publication Data
US 2004/0075135 A1 Apr. 22, 2004

(51) Int. Cl.$^7$ .............................................. H01L 29/76
(52) U.S. Cl. ...................... 257/327; 257/288; 257/368; 438/197
(58) Field of Search ................................. 257/288, 327, 257/368, E21.359, E21.368, E27.04, E29.338; 438/197

(56) References Cited

U.S. PATENT DOCUMENTS

| | | | | |
|---|---|---|---|---|
| 4,811,065 A | * | 3/1989 | Cogan ......................... | 257/328 |
| 5,744,994 A | | 4/1998 | Williams .................... | 327/374 |
| 5,973,367 A | | 10/1999 | Williams .................... | 257/365 |

FOREIGN PATENT DOCUMENTS

| | | |
|---|---|---|
| DE | 35 07 181 | 9/1986 |
| JP | 05 291 507 | 11/1993 |

* cited by examiner

Primary Examiner—Nathan J. Flynn
Assistant Examiner—Scott R. Wilson
(74) Attorney, Agent, or Firm—Kenyon & Kenyon

(57) ABSTRACT

The invention concerns a monolithically integrated semiconductor component, having a first charge carrier region of a first charge carrier doping; at least two second charge carrier regions with opposite charge carrier doping, patterned within the first charge carrier region at a spacing from one another, and third charge carrier regions, with the first charge carrier doping, patterned within the second charge carrier regions, a PN transition being short-circuited between the second charge carrier regions and the third charge carrier regions via a contacting area (source connection), the first charge carrier region being equipped with a contact (drain connection), and the second charge carrier regions being invertable by means of a contacting area in the region between the first charge carrier region and the third charge carrier region; and having at least one Schottky diode connected in parallel with the charge carrier region and the charge carrier region. Provision is made for the first charge carrier region to have a further contacting area, this contacting area being additionally doped near the surface, depending on the doping concentration of the first region, with a further near-surface charge carrier region of higher concentration, so that an ohmic contact is created and is connected to the anode connection of the at least one Schottky diode.

4 Claims, 2 Drawing Sheets

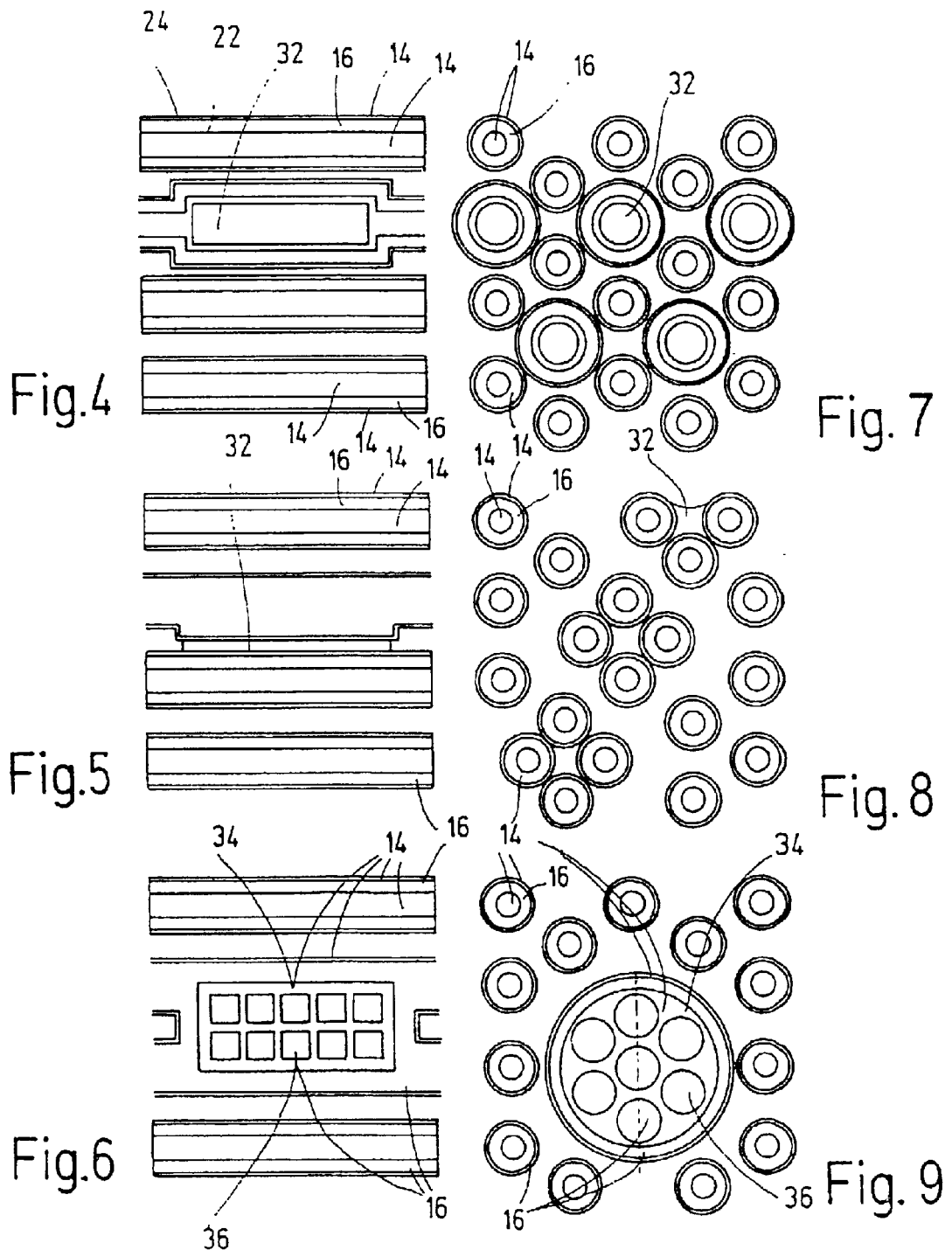

MONOLITHCALLY INTEGRATED SEMICONDUCTOR COMPONENT

FIELD OF THE INVENTION

The invention concerns a monolithically integrated semiconductor component.

BACKGROUND INFORMATION

Monolithically integrated semiconductor components of the species are known. They include, for example, a vertical MOS (metal oxide silicon) transistor that has a relatively lightly doped substrate region of a first conductivity type and a more highly doped layer of the same conductivity type for contacting (drain connection). Introduced into the substrate region is at least one conductivity region of opposite conductivity type, which in each case surrounds a further conductivity region of the first conductivity type.

This results in the formation of two PN transitions, of which a first PN transition is short-circuited by a source connection. Applied on the substrate surface is an MOS structure by means of which the region of the second charge carrier regions close to the surface can be inverted, so that a conductive connection is created between the source connection and drain connection. The second charge carrier region is connected in electrically conductive fashion to the third charge carrier region through the source connection (short-circuiting the first PN transition), resulting in formation of a parasitic inverse diode. In a number of circuit variants, this parasitic inverse diode that necessarily forms can be used as a freewheeling diode. For example, if an inductive load is to be switched by means of the monolithically integrated component, the freewheeling diode allows reverse commutation of the current. If the inductive load is, for example, triggered with a bridge circuit made up of at least two MOS transistors that are connected as pulse-width-modulated inverters in a boost chopper circuit, a first MOS transistor is triggered in pulsed fashion so that the inductive load either freewheels via the parasitic inverse diode of the further MOS transistor or is recharged via the activated second MOS transistor. The switching-on operation of the pulse-triggered MOS transistor is relevant in this context, since what can occur here is that the inverse diode is energized and the charge is drained because the other MOS transistor is not conductive. This results in a so-called current breakdown situation that causes steep increases in $\Delta I/\Delta t$. These in turn cause overvoltages and high-frequency oscillations that result in undesirable interference effects.

It is known to connect, in parallel with the parasitic inverse diodes, Schottky diodes that have a lower forward voltage. As a result, the parasitic inverse diodes remain inactive so that no stored charge needs to be drained out of the substrate region of the MOS transistors. It is known from European Published Patent Application No. 0 899 791 to integrate the Schottky diodes into the monolithic component as parallel freewheeling diodes, necessitating an additional charge carrier implantation to establish a barrier. This additional charge carrier implantation requires considerable technical outlay, however, thereby increasing process costs.

SUMMARY OF THE INVENTION

The monolithically integrated semiconductor component, in contrast, the advantage that a Schottky diode connected in parallel with the parasitic inverse diode can be implemented in simple fashion. Because the first charge carrier region includes a further contacting area—that contacting area being additionally doped near the surface, depending on the doping concentration of the first charge carrier region, with a further near-surface charge carrier region of higher concentration, and being connected to the anode connection of the at least one Schottky diode—it is possible to generate a shielding structure within the first charge carrier region if the additional contacting area is pulled to a potential above the potential of the second charge carrier region. It is thereby possible to reliably design the so-called Schottky clamp for higher-inhibition MOS transistors, in which context a safety factor increase for the breakdown voltage (taking into account the forward voltage tolerances) can be reduced and optionally can be left out of consideration. Reducing the safety factor increase on the breakdown voltage means that the additional voltage drops which occur in conducting situations because of those safety factor increases are eliminated. The forward voltage tolerance thus has no substantial influence on the junction voltage of the parasitic inverse diodes, which in the context of higher-inhibition MOS transistors remain below 650 mV in order to prevent forward operation of the parasitic inverse diodes.

The additional contacting area which is all that is provided in order to implement the present invention can easily be achieved by a slight process modification in the manufacture of the monolithically integrated semiconductor component, by the fact that upon deposition of the metallizations for the contact areas of the source connections, at least one additional mask opening is simultaneously provided for the additional contacting area. Additional process steps are thus not necessary. All that is done is a change in the layout of the masking level for manufacturing the metallizations.

The Schottky diode that can be incorporated into the circuit arrangement by way of the additional contacting area moreover yields a reduction in power dissipation when the Schottky diode is inhibited or conductive. As a result of the shielding structure created beneath the additional contacting area in the first charge carrier region, only a relatively small blocking voltage occurs across the Schottky diode, so that the very high blocking-state currents typical of Schottky diodes can be greatly reduced or, conversely, a lower forward voltage can be achieved.

It is additionally advantageous that the Schottky diodes can easily be adapted to the monolithically integrated semiconductor component. The Schottky diode connected externally to the additional contacting area can, for example, be selected with regard to modified blocking voltage criteria or thermal criteria. Lastly, because it is now easy to arrange the Schottky diode physically separately from the MOS transistor structure, the additional power dissipation of the Schonky diode can occur in areas in which it does not contribute to heating of the monolithically integrated component. The fact that external utilization of the Schottky diode is easily provided furthermore offers the advantage that when MOS transistor structures are connected in parallel, it is not necessary to associate a separate Schottky diode with each transistor structure, but instead a common Schottky diode can be provided for multiple transistor structures.

BRIEF DESCRIPTION OF THE DRAWINGS

FIG. 4 shows a first layout of the semiconductor component according to the present invention.

FIG. 5 shows a second layout of the semiconductor component according to the present invention.

FIG. 6 shows a third layout of the semiconductor component according to the present invention.

FIG. 7 shows a fourth layout of the semiconductor component according to the present invention.

FIG. 8 shows a fifth layout of the semiconductor component according to the present invention.

FIG. 9 shows a sixth layout of the semiconductor component according to the present invention.

DETAILED DESCRIPTION

Figure 1:
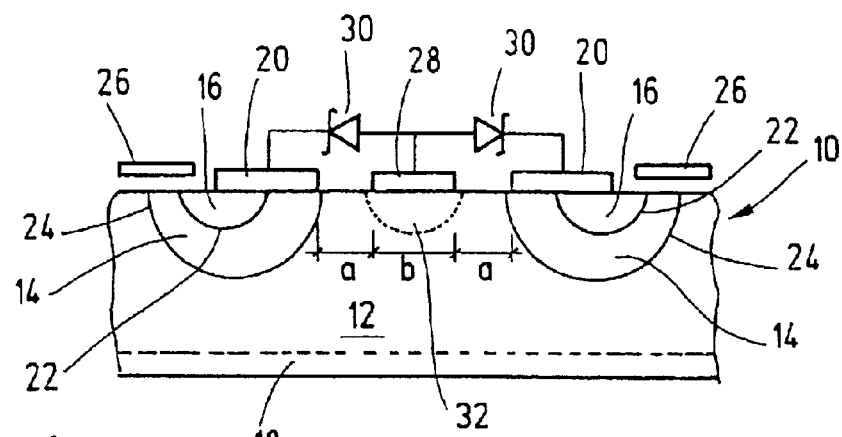
FIG. 1 is a schematic side view of a monolithically integrated component according to the present invention.

FIG. 1 shows a monolithically integrated semiconductor component 10 that is embodied as an MOS field effect transistor. Semiconductor component 10 includes a drift region 12 having a first charge carrier doping (for example, n-doped). Charge carrier regions 14 having a charge carrier doping (in the example, p-doping) opposite to the first charge carrier region (drift region) 12 are introduced into drift region 12. Further charge carrier regions 16 are integrated into charge carrier regions 14. Charge carrier regions 16 possess the same charge carrier doping as charge carrier region 12, but are more highly doped (in the example, n+-doped). Charge carrier region 12 is arranged on a layer 18 that possesses the same charge carrier doping as charge carrier region 12 but is more highly doped (in the example, n+-doped). Metallizations 20 that short-circuit charge carrier regions 14 and 16 in the region of their PN transition 22 are patterned on the surface of semiconductor component 10. A further metallization (contacting area) 26 is arranged, over an oxide that is not depicted, above PN transitions 24 between charge carrier regions 14 and 12. Metallization 26 extends over the entire channel region.

Charge carrier region 12 is equipped, by way of a highly doped region of the first conductivity type (in the example, n+-doped), with a further metallization (contacting area) 28 that is located between adjacent PN transitions 24. A spacing a between metallization 28 and PN transitions 24 is the same in each case. Metallization 28 is connected to metallizations 20 via external Schottky diodes 30, metallization 28 being connected in each case to the anodes of Schottky diodes 30.

Metallization 20 constitutes the source connection, layer 18 the drain connection, and metallization 26 the gate connection of the MOS transistor. When a control voltage is applied to gate connection 26, near-surface conduction channels form in charge carrier regions 14 so that source connection 20 is connected in electrically conductive fashion to drain connection 18, and the MOS transistor becomes conductive.

By way of the total spacing a+b+a of charge carrier regions 14, it is possible to define the blocking voltage through PN transition 24 above which a near-surface region 32, more highly doped for contacting purposes, of charge carrier region 12 remains at a fixed voltage potential that is independent of any further rise in the drain voltage. The voltage potential in region 32 is thereby limited to a geometry-dependent constant (a+b+a). Schottky diodes 30 contacted via metallization 28 can thus be designed for a relatively low blocking voltage that is determined by the voltage potential in region 32. Region 32 thus constitutes a shielding structure for the electrical application of Schottky diodes 30, resulting in the aforementioned limiting of the blocking voltage. This simultaneously yields a reduction in the blocking-state currents and the power dissipation of Schottky diodes 30. In a manner known per se, Schottky diodes 30 can be used as freewheeling diodes, for example for switching inductive loads in the bridge circuit mentioned at the outset.

Figure 2:
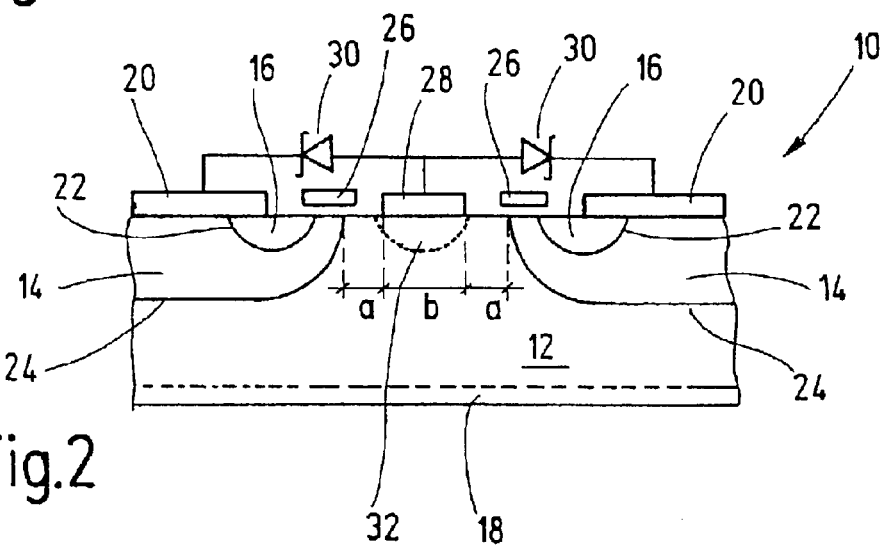
FIG. 2 is another schematic side view of a monolithically integrated component according to the present invention.

FIG. 2 shows a modified embodiment, parts identical to those in FIG. 1 being labeled with the same reference characters and not explained again. In contrast to the variant embodiment in FIG. 1, in which a source-side drain contact is implemented, in FIG. 2 a drain contact is implemented on the channel side (conductive channel through charge carrier regions 14 upon activation of metallizations 26). The reader is referred to the description of FIG. 1 as regards function.

Figure 3:
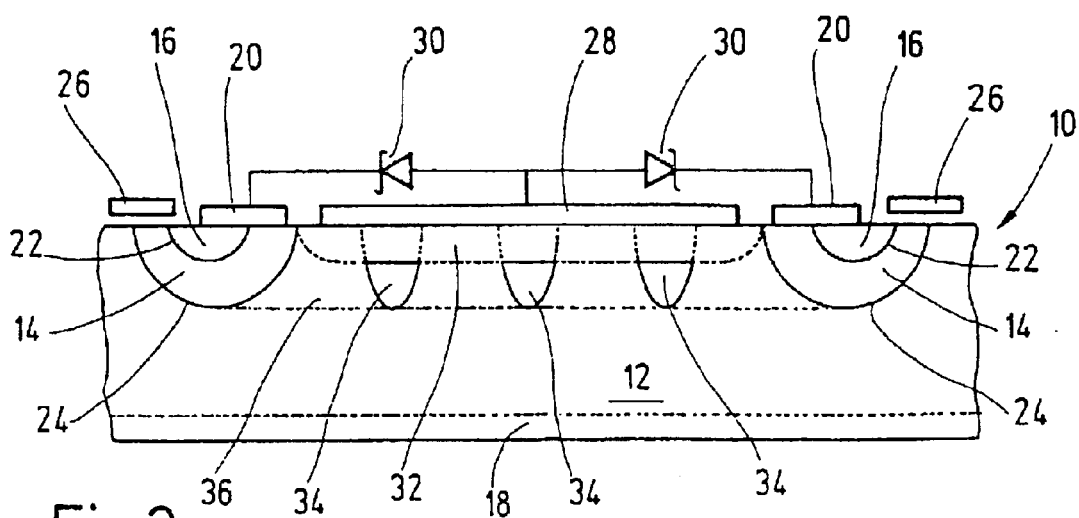
FIG. 3 is a schematic side view of a monolithically integrated component according to the present invention.

FIG. 3 shows a variant embodiment in which buried charge carrier regions 34 that contain the same charge carrier doping as charge carrier regions 14 are arranged between charge carrier regions 14. Charge carrier regions 34 are arranged in a grid pattern, resulting in connections 36, as indicated here, between charge carrier regions 14. Buried structures 34 and conductive connections 36 cause the formation of a JFET structure (known per se) that in this case takes over a shielding structure of region 32. Any rise in potential in region 32 is thereby also limited, resulting in the aforementioned reduction in the blocking voltage of Schottky diodes 30.

FIGS. 4 through 9 schematically show, in plan view, a number of variant layouts of component 10. FIGS. 4 through 6 relate to a so-called strip design, while FIGS. 7 through 9 concern a so-called cell design. The individual doping regions are labeled with the reference characters explained in FIGS. 1 through 3, and the reader is therefore referred to those Figures as regards the arrangement.

FIG. 4 through 7 correspond to FIG. 1, FIGS. 5 through 8 to FIG. 2, and FIGS. 6 and 9 to FIG. 3.

What is claimed is:

1. A monolithically integrated semiconductor component, comprising:

a first charge carrier region of a first charge carrier doping;

at least two second charge carrier regions provided with opposite charge carrier doping and patterned within the first charge carrier region at a spacing from one another;

a first contacting area corresponding to a source connection;

a second contacting area;

third charge carrier regions provided with the first charge carrier doping and patterned within the at least two second charge carrier regions, wherein:

a PN transition is short-circuited between the at least two second charge carrier regions and the third charge carrier regions via the first contacting area, the first charge carrier region includes a contact corresponding to a drain connection, and the at least two second charge carrier regions are invertible by way of the second contacting area in a region between the first charge carrier region and the third charge carrier regions;

at least one Schottky diode connected in parallel with the first charge carrier region;

a third contacting area applied onto the first charge carrier region, the third contacting area being associated with a further charge carrier region that is more highly doped as compared to a doping concentration of the first charge carrier region so that an ohmic contact is created, the ohmic contact being connected to an anode connection of the at least one Schottky diode; and a source-side drain contact.

2. The semiconductor component as recited in claim 1, wherein:

the third contacting area is positioned in a region of a shielding structure that is established when a drain voltage is applied.

3. The semiconductor component as recited in claim 2, wherein:

the shielding structure is defined by a spacing of PN transitions of adjacent ones of the at least two second charge carrier regions.

4. The semiconductor component as recited in claim 2, wherein:

the shielding structure includes a buried JFET structure.

* * * * *